(12) United States Patent
Sonoda (10) Patent No.: US 11,430,685 B2
(45) Date of Patent: Aug. 30, 2022

(54) WAFER PLACEMENT APPARATUS AND METHOD OF MANUFACTURING THE SAME

(71) Applicant: NGK INSULATORS, LTD., Nagoya (JP)

(72) Inventor: Takanori Sonoda, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 354 days.

(21) Appl. No.: 16/818,055

(22) Filed: Mar. 13, 2020

(65) Prior Publication Data
US 2020/0303230 A1 Sep. 24, 2020

(30) Foreign Application Priority Data

Mar. 19, 2019 (JP) .............................. JP2019-051398

(51) Int. Cl.
*H01L 21/683* (2006.01)
*H02N 13/00* (2006.01)
*H01L 21/60* (2006.01)

(52) U.S. Cl.
CPC ...... *H01L 21/6833* (2013.01); *H01L 21/6836* (2013.01); *H02N 13/00* (2013.01); *H01L 2021/6015* (2013.01)

(58) Field of Classification Search
CPC ............. H01L 21/6833; H01L 21/6836; H01L 2021/6015; H02N 13/00
See application file for complete search history.

(56) References Cited

U.S. PATENT DOCUMENTS

| 5,548,470 A * | 8/1996 | Husain ................. H01L 21/6833 361/234 |
| 6,522,519 B1 * | 2/2003 | Hirayanagi ......... H01L 21/6833 361/233 |
| 7,068,489 B2 * | 6/2006 | Migita ................ H01L 21/6831 361/230 |

(Continued)

FOREIGN PATENT DOCUMENTS

| JP | 2003-224180 A | 8/2003 |
| JP | 2008-016727 A1 | 1/2008 |

(Continued)

OTHER PUBLICATIONS

Korean Office Action (Application No. 10-2020-0031850) dated Jul. 5, 2021 (with English translation).

(Continued)

*Primary Examiner* — Scott Bauer
(74) *Attorney, Agent, or Firm* — Burr & Brown, PLLC (57) ABSTRACT

A wafer placement apparatus includes a disc-shaped ceramic plate having an upper surface as a wafer placement surface and in which an electrode is embedded; a disc-shaped cooling plate provided on a lower surface, opposite the wafer placement surface, of the ceramic plate; and a resin adhesive-sheet layer with which a bonding surface as the lower surface of the ceramic plate and a bonding surface as an upper surface of the cooling plate are bonded to each other, wherein at least one of the bonding surface of the ceramic plate and the bonding surface of the cooling plate has a surface roughness Ra that is higher in an outer part of the bonding surface than in an inner part of the bonding surface.

5 Claims, 5 Drawing Sheets (56) References Cited

U.S. PATENT DOCUMENTS

| | | | |
|---|---|---|---|
| 8,641,825 B2* | 2/2014 | Yonekura | C23C 16/4581 |
| | | | 156/345.55 |
| 2002/0036373 A1* | 3/2002 | Kosakai | H01L 21/6838 |
| | | | 269/21 |
| 2003/0161088 A1 | 8/2003 | Migita | |
| 2006/0102288 A1* | 5/2006 | Satoh | H01J 37/32642 |
| | | | 156/345.47 |
| 2008/0006207 A1 | 1/2008 | Miyagawa et al. | |
| 2008/0083723 A1 | 4/2008 | Tsukamoto et al. | |
| 2010/0078424 A1* | 4/2010 | Tsukamoto | H01L 21/67103 |
| | | | 219/448.12 |

FOREIGN PATENT DOCUMENTS

| | | |
|---|---|---|
| JP | 2009-071023 A1 | 4/2009 |
| JP | 2010-506381 A1 | 5/2010 |
| JP | 2014-052340 A | 3/2014 |
| JP | 2016-001757 A | 1/2016 |

OTHER PUBLICATIONS

"What is Surface Roughness" in "Introduction to Roughness.com" Keyence Co., Ltd.'s website <URL:https://www.keyence.co.jp/ss/products/microscope/roughness/basics/about.jsp> [searched on Reiwa 3 (Aug. 19, 2021) (with English translation).

Japanese Notice of Opposition (Japanese Patent No. 6839314) dated Sep. 28, 2021 (with English translation).

Taiwanese Office Action (Application No. 109108739) dated Mar. 3, 2021.

* cited by examiner

WAFER PLACEMENT APPARATUS AND METHOD OF MANUFACTURING THE SAME

BACKGROUND OF THE INVENTION

1. Field of the Invention

The present invention relates to a wafer placement apparatus and a method of manufacturing the same.

2. Description of the Related Art

A known wafer placement apparatus includes a disc-shaped ceramic plate having an upper surface serving as a wafer placement surface; and a disc-shaped cooling plate provided on a lower surface, opposite the wafer placement surface, of the ceramic plate, the ceramic plate and the cooling plate being bonded to each other with a resin adhesive sheet (see PTL 1, for example). The wafer placement apparatus according to PTL 1 is manufactured by bonding the ceramic plate and the cooling plate to each other with the adhesive sheet to form a stack, and the stack is pressed in a vacuum while being heated.

CITATION LIST

Patent Literature

PTL 1: Japanese Unexamined Patent Application Publication No. 2009-71023

SUMMARY OF THE INVENTION

In the wafer placement apparatus according to PTL 1, an adhesive-sheet layer occasionally becomes thin in an outer peripheral part. That is, the thickness of the adhesive-sheet layer occasionally becomes nonuniform. If the thickness of the adhesive-sheet layer is nonuniform, heat conduction between the ceramic plate and the cooling plate through the adhesive-sheet layer varies. Consequently, the in-plane temperature of a wafer mounted thereon becomes nonuniform.

The present invention is to solve the above problem, and the chief object of the present invention is to make the thickness of the adhesive-sheet layer uniform and thus make the in-plane temperature of the wafer uniform.

A wafer placement apparatus according to the present invention includes:

a disc-shaped ceramic plate having an upper surface as a wafer placement surface and in which an electrode is embedded;

a disc-shaped cooling plate provided on a lower surface, opposite the wafer placement surface, of the ceramic plate; and a resin adhesive-sheet layer with which a bonding surface at the lower surface of the ceramic plate and a bonding surface at an upper surface of the cooling plate are bonded to each other, wherein at least one of the bonding surface of the ceramic plate and the bonding surface of the cooling plate has a surface roughness Ra that is higher in an outer part of the bonding surface than in an inner part of the bonding surface.

In the above wafer placement apparatus, at least one of the bonding surface at the lower surface of the ceramic plate and the bonding surface at the upper surface of the cooling plate has a surface roughness (arithmetic mean roughness) Ra that is higher in the outer part than in the inner part. If the surface roughness Ra in the inner part and the surface roughness Ra in the outer part are the same on both of the bonding surfaces, the adhesive-sheet layer tends to become thinner in the outer part than in the inner part during a process of pressing or the like. This would be because of the following reason. The adhesive sheet held between the ceramic plate and the cooling plate is not restrained only on the outer periphery. Therefore, the outer part of the adhesive sheet is more likely to expand. Accordingly, if the surface roughness Ra of the bonding surface is increased in the outer part where the adhesive sheet is more likely to expand, the expansion of the adhesive sheet in the outer part is suppressed by an anchoring effect. Hence the thickness of the adhesive-sheet layer in the wafer placement apparatus can be made uniform. Accordingly, the in-plane temperature of a wafer to be mounted thereon can be made uniform. If the surface roughness Ra is higher in the outer part than in the inner part on both of the bonding surfaces, the thickness of the adhesive-sheet layer can be made more uniform, which is preferable. If the surface roughness Ra of the bonding surface in the inner part is increased to be the same as the surface roughness Ra in the outer part, the expansion of the adhesive sheet is suppressed not only in the outer part but also in the inner part. In such a case, the adhesive sheet still becomes thinner in the outer part than in the inner part. Hence, the surface roughness Ra needs to be made higher in the outer part than in the inner part. The part having the surface roughness Ra, that is, the outer part may be the part that is more than 85% of the diameter of the bonding surface, or the part that is more than 90% of the diameter of the bonding surface, or the part that is more than 95% of the diameter of the bonding surface.

In this specification, the terms "upper" and "lower" do not define the absolute positional relationship but define the relative positional relationship. Therefore, depending on the orientation of the wafer placement apparatus, the "upper" side and the "lower" side may be expressed in different ways: the "lower" side and the "upper" side, the "left" side and the "right" side, or the "front" side and the "rear" side.

In the wafer placement apparatus according to the present invention, the electrode may include heater electrodes that are embedded in an inner zone and an outer zone, respectively, of the ceramic plate, the inner zone corresponding to the inner part, the outer zone corresponding to the outer part. If the surface roughness Ra in the outer part of the bonding surface is increased, the thickness of the adhesive-sheet layer can be made uniform as described above. Accordingly, the difference in heat conduction attributed to the difference in the thickness of the adhesive-sheet layer can be reduced. However, since the surface roughness Ra of the bonding surface varies between that in the inner part and that in the outer part, heat conduction between the ceramic plate and the cooling plate through the adhesive-sheet layer may vary, to a slight extent though, between that in the inner part and that in the outer part. In the present invention, the heater electrode provided in the inner zone and the heater electrode provided in the outer zone are separate from each other. Therefore, in accordance with the difference in heat conduction between the inner part and the outer part, the temperature of the heater electrode in the inner zone and the temperature of the heater electrode in the outer zone can be controlled independently of each other. Accordingly, the in-plane temperature of the wafer can be made more uniform.

In the wafer placement apparatus according to the present invention, the bonding surface of the ceramic plate and the bonding surface of the cooling plate may each have a radius of 135 mm or greater. If the bonding surface of the ceramic plate and the bonding surface of the cooling plate each have a radius of 135 mm or greater, the adhesive sheet particularly tends to be thinner in the outer part than in the inner part unless there is any difference in surface roughness Ra over the entirety of the bonding surface. Therefore, the application of the present invention to such a case has a greater significance. In this case, the boundary between the inner part and the outer part may form a circle having a radius of 135 mm or greater.

In the wafer placement apparatus according to the present invention, at least one of the bonding surface of the ceramic plate and the bonding surface of the cooling plate may have a surface roughness Ra in the outer part that is higher than 1.6 μm. In such a case, since the anchoring effect is greater in the outer part, the expansion of the adhesive sheet in the outer part is suppressed further. Hence, the thickness of the adhesive-sheet layer can be made more uniform. The surface roughness Ra in the inner part may be, for example, 1.6 μm or lower. In such a case, the adhesive sheet expands to some extent in the inner part. Accordingly, the thickness of the adhesive-sheet layer can be made more uniform.

A method of manufacturing a wafer placement apparatus according to the present invention includes:

(a) a step of preparing a disc-shaped ceramic plate in which an electrode is embedded, a disc-shaped cooling plate, and an adhesive sheet; and (b) a step of bonding the ceramic plate and the cooling plate to each other by using the adhesive sheet, wherein at least one of the ceramic plate and the cooling plate to be prepared in the step (a) has a bonding surface with a surface roughness Ra that is higher in an outer part of the bonding surface than in an inner part of the bonding surface, and wherein the step (b) is performed by using the bonding surface with the surface roughness Ra that is higher in the outer part than in the inner part.

In the above method of manufacturing a wafer placement apparatus, the expansion of the adhesive sheet in the outer part is suppressed by the anchoring effect. Therefore, the thickness of the adhesive-sheet layer in the wafer placement apparatus can be made uniform. Accordingly, the in-plane temperature of the wafer can be made uniform. If the surface roughness Ra is higher in the outer part than in the inner part on both of the bonding surfaces, the thickness of the adhesive-sheet layer can be made more uniform, which is more preferable.

DETAILED DESCRIPTION OF THE INVENTION

Figure 1:
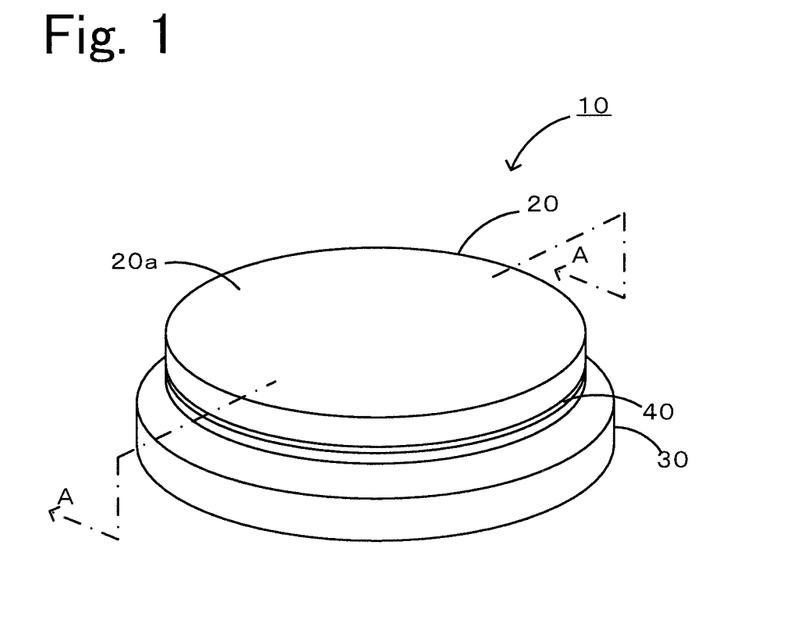
FIG. 1 is a perspective view of an electrostatic-chuck heater 10.
Figure 2:
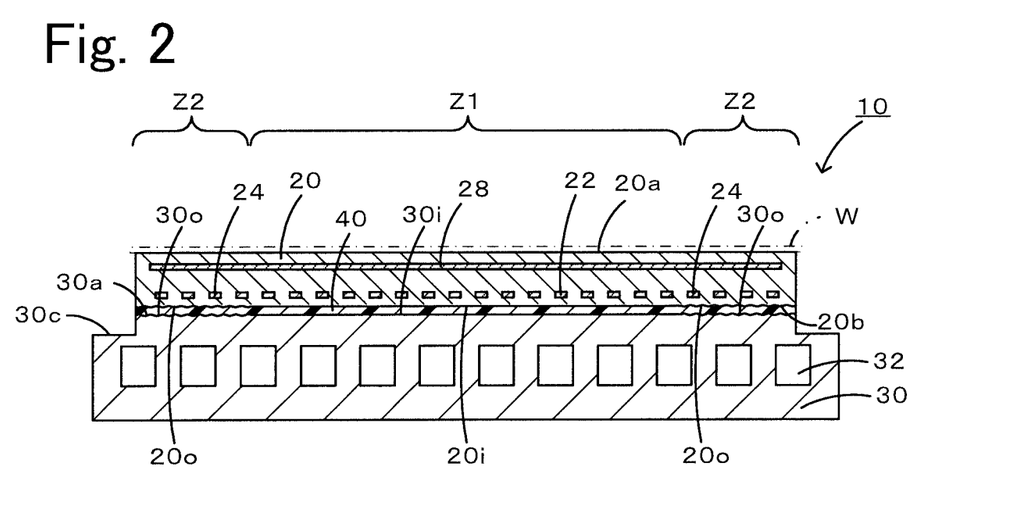
FIG. 2 is a sectional view taken along line A-A illustrated in FIG. 1.
Figure 3:
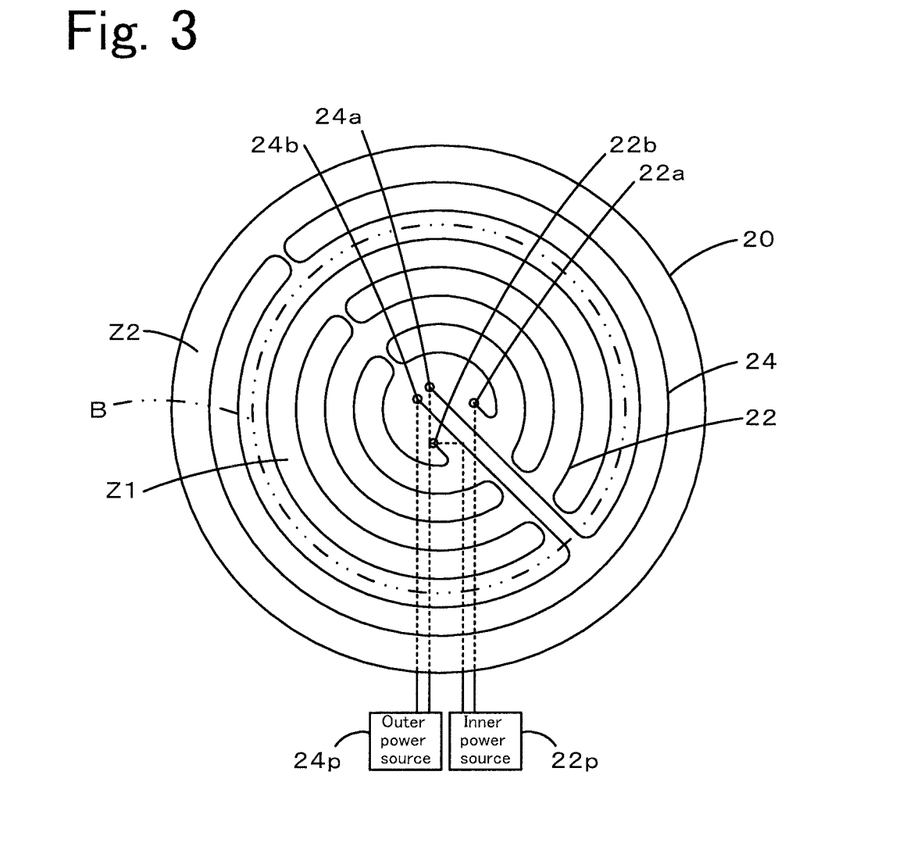
FIG. 3 is a plan view of heater electrodes 22 and 24.
Figure 4:
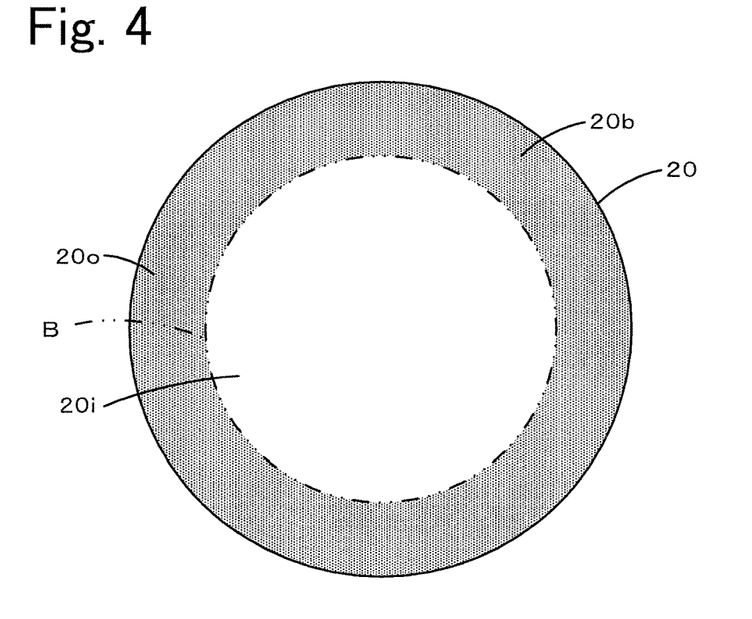
FIG. 4 is a bottom view of a ceramic plate 20.
Figure 5:
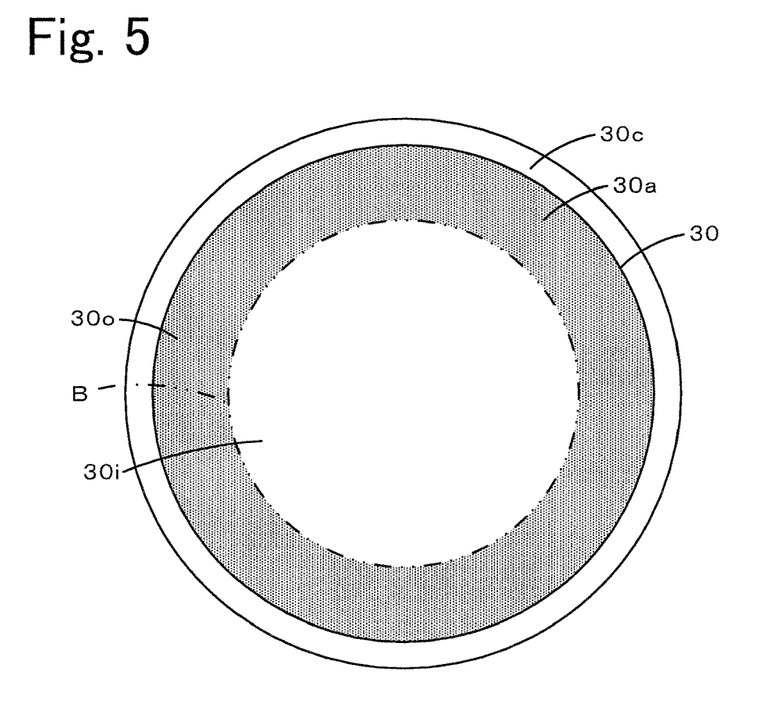
FIG. 5 is a plan view of a cooling plate 30.
Figure 6A:
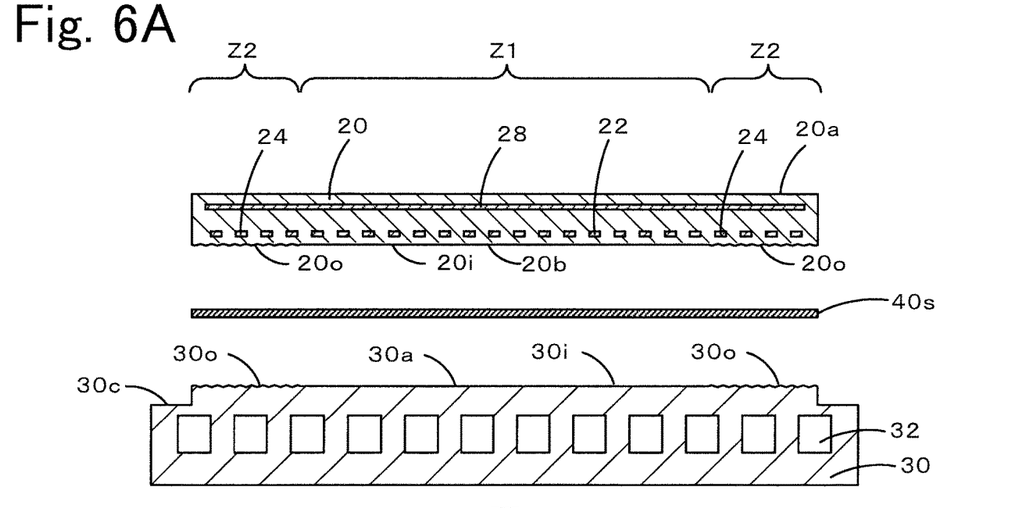
FIGS. 6A to 6C include diagrams illustrating a method of manufacturing the electrostatic-chuck heater 10.
Figure 6B:
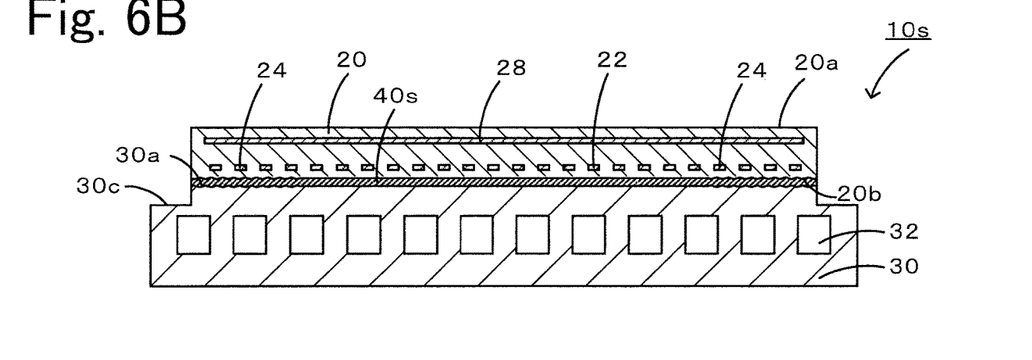
Figure 6C:
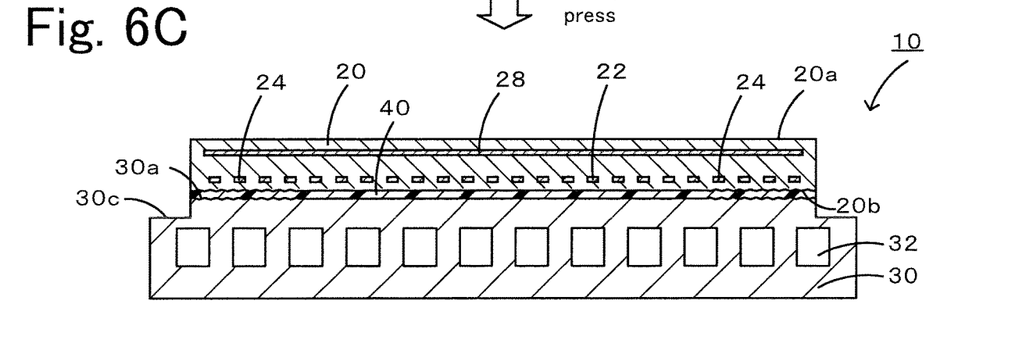

Preferred embodiments of the present invention will now be described with reference to the drawings. FIG. 1 is a perspective view of an electrostatic-chuck heater 10 which is one embodiment of the wafer placement apparatus of the present invention. FIG. 2 is a sectional view taken along line A-A illustrated in FIG. 1. FIG. 3 is a plan view of heater electrodes 22 and 24. FIG. 4 is a bottom view of a ceramic plate 20. FIG. 5 is a plan view of a cooling plate 30. FIGS. 6A to 6C include diagrams illustrating a method of manufacturing the electrostatic-chuck heater 10.

The electrostatic-chuck heater 10 includes the ceramic plate 20 having an upper surface serving as a wafer placement surface 20a; and the cooling plate 30 provided on a lower surface 20b, opposite the wafer placement surface 20a, of the ceramic plate 20. The lower surface 20b, serving as a bonding surface, of the ceramic plate 20 and an upper surface 30a, serving as a bonding surface, of the cooling plate 30 are bonded to each other with a resin adhesive-sheet layer 40 interposed therebetween.

The ceramic plate 20 is a disc-shaped plate made of a ceramic material such as aluminum nitride or alumina. The diameter of the ceramic plate 20 is not specifically limited to but is about, for example, 300 mm. As illustrated in FIG. 2, the ceramic plate 20 has an inner heater electrode 22, an outer heater electrode 24, and an electrostatic electrode 28 that are embedded therein. The inner heater electrode 22 and the outer heater electrode 24 are each formed as a coil or a printed pattern made of a material chiefly composed of, for example, molybdenum, tungsten, or tungsten carbide. The inner heater electrode 22 forms a single continuous line extending from one end 22a to an other end 22b in such a manner as to run over the entirety of a circular inner zone Z1 (an area on the inner side of a virtual boundary B illustrated in FIG. 3). The inner zone Z1 is concentric to the ceramic plate 20 and has a smaller diameter than the ceramic plate 20. The diameter of the inner zone Z1 is not specifically limited to but is about, preferably 85% or more and 95% or less of the diameter of the ceramic plate 20; for example, 270 mm. The one end 22a and the other end 22b of the inner heater electrode 22 are connected to an inner power source 22p. The outer heater electrode 24 forms a single continuous line extending from one end 24a to an other end 24b in such a manner as to run over the entirety of an annular outer zone Z2 (an area on the outer side of the virtual boundary B illustrated in FIG. 3) that surrounds the inner zone Z1. The one end 24a and the other end 24b of the outer heater electrode 24 are connected to an outer power source 24p. The electrostatic electrode 28 is formed as a mesh or a plate made of a material chiefly composed of, for example, molybdenum, tungsten, or tungsten carbide. The electrostatic electrode 28 extends parallel to the wafer placement surface 20a of the ceramic plate 20. The electrostatic electrode 28 is connected to an electrostatic-electrode power source (not illustrated).

As illustrated in FIG. 4, the lower surface 20b of the ceramic plate 20 has a higher surface roughness Ra in an outer part 20o thereof than in an inner part 20i thereof. The surface roughness Ra of the outer part 20o is not specifically limited to but is higher than, for example, 1.6 μm. In FIG. 4, a part having a surface roughness Ra higher than 1.6 μm is hatched, and the other part is left blank. In plan view, the boundary between the inner part 20i and the outer part 20o coincides with the virtual boundary B illustrated in FIG. 3.

The cooling plate 30 is a disc-shaped plate made of metal such as aluminum or an aluminum alloy and has a greater diameter than the ceramic plate 20. As illustrated in FIG. 2, the cooling plate 30 has a circular upper surface 30a having the same diameter as the ceramic plate 20, and an annular step surface 30c that is at a lower level than the upper surface 30a and surrounds the upper surface 30a. The ceramic plate 20 is bonded to the upper surface 30a. A focus ring (also referred to as protection ring, not illustrated) is to be mounted on the step surface 30c. The cooling plate 30 has a refrigerant passage 32 therein. The refrigerant passage 32 forms a single continuous line extending from the inlet to the outlet thereof and runs over the entirety of a region of the cooling plate 30 over which the ceramic plate 20 spreads. The inlet and the outlet of the refrigerant passage 32 are connected to an external cooling device (not illustrated). Refrigerant discharged from the outlet undergoes temperature adjustment in the external cooling device, re-enters the inlet, and flows through the refrigerant passage 32 again.

As illustrated in FIG. 5, the upper surface 30a of the cooling plate 30 has a higher surface roughness Ra in an outer part 30o than in an inner part 30i. The surface roughness Ra of the outer part 30o is not specifically limited to but is higher than, for example, 1.6 μm. In FIG. 5, a part having a surface roughness Ra higher than 1.6 μm is hatched, and the other part is left blank. In plan view, the boundary between the inner part 30i and the outer part 30o coincides with the virtual boundary B illustrated in FIG. 3.

The adhesive-sheet layer 40 is formed of an insulating adhesive sheet made of resin such as silicone resin, acrylic resin, polyimide resin, or epoxy resin. The adhesive-sheet layer 40 is a circular layer having the same diameter as the lower surface 20b of the ceramic plate 20 and the upper surface 30a of the cooling plate 30. The adhesive-sheet layer 40 may have either a single-layer structure or a multilayer structure. Specific examples of the adhesive-sheet layer 40 are as follows: a sheet including a polypropylene core with acrylic resin layers provided on two respective sides thereof, a sheet including a polyimide core with silicone resin layers provided on two respective sides thereof, a single-layer sheet made of epoxy resin, and the like.

Now, a method of manufacturing the electrostatic-chuck heater 10 will be described. The method includes a step (a) of preparing a ceramic plate 20, a cooling plate 30, and an adhesive sheet 40s; and a step (b) of bonding the ceramic plate 20 and the cooling plate 30 to each other by using the adhesive sheet 40s.

The ceramic plate 20 to be prepared in the step (a) is the same as the above-described ceramic plate 20 and has an inner heater electrode 22, an outer heater electrode 24, and an electrostatic electrode 28 that are embedded therein. As illustrated in FIG. 6A, the lower surface 20b of the ceramic plate 20 has a higher surface roughness Ra in the outer part 20o thereof than in the inner part 20i thereof. Such a ceramic plate 20 may be manufactured as follows, for example: a ceramic plate having a lower surface 20b with a surface roughness Ra of 1.6 μm or lower over the entirety thereof is prepared, and the outer part 20o is roughened by grinding, etching, or the like until the surface roughness Ra of the outer part 20o becomes higher than 1.6 μm.

The cooling plate 30 to be prepared in the step (a) is the same as the above-described cooling plate 30 and has a refrigerant passage 32 therein. As illustrated in FIG. 6A, the upper surface 30a of the cooling plate 30 has a higher surface roughness Ra in the outer part 30o thereof than in the inner part 30i thereof. Such a cooling plate 30 may be manufactured as follows, for example: a cooling plate having an upper surface 30a with a surface roughness Ra of 1.6 μm or lower over the entirety thereof is prepared, and the outer part 30o is roughened by grinding, etching, or the like until the surface roughness Ra of the outer part 30o becomes higher than 1.6 μm.

The adhesive sheet 40s to be prepared in the step (a) is an insulating sheet made of resin such as silicone resin, acrylic resin, polyimide resin, or epoxy resin. The adhesive sheet 40s is a circular sheet with substantially the same diameter as the lower surface 20b of the ceramic plate 20 and the upper surface 30a of the cooling plate 30. The adhesive sheet 40s may have either a single-layer structure or a multilayer structure. Specific examples of the adhesive sheet 40s are as follows: a sheet including a polypropylene core with acrylic resin layers provided on two respective sides thereof, a sheet including a polyimide core with silicone resin layers provided on two respective sides thereof, a single-layer sheet made of epoxy resin, and the like.

In the step (b), the ceramic plate 20, the cooling plate 30, and the adhesive sheet 40s are first arranged such that the adhesive sheet 40s is positioned between the lower surface 20b of the ceramic plate 20 and the upper surface 30a of the cooling plate 30, whereby a stack 10s is obtained (see FIG. 6B). Subsequently, while the stack 10s is heated, the stack 10s is pressed in a vacuum, whereby the adhesive sheet 40s is hardened into an adhesive-sheet layer 40, and the ceramic plate 20 and the cooling plate 30 are firmly bonded to each other with the adhesive-sheet layer 40 (see FIG. 6C). The heating temperature is not specifically limited to but is about, for example, 90 to 180° C., which may be set in accordance with the kind of the adhesive sheet 40s. The pressure is not specifically limited to but is about, for example, 0.4 to 1.5 MPa, which may be set in accordance with the kind of the adhesive sheet 40s. If the heat to be applied is 90 to 110° C., the pressure to be applied may be 1.1 to 1.5 MPa. If the heat to be applied is 160 to 180° C., the pressure to be applied may be 0.4 to 0.8 MPa. If the adhesive sheet 40s is extruded from the outer periphery, the extruded part of the adhesive sheet 40s may be removed.

Now, a usage of the electrostatic-chuck heater 10 will be described. First, a wafer W is mounted on the wafer placement surface 20a of the electrostatic-chuck heater 10, and a focus ring (not illustrated) is mounted on the step surface 30c. Then, a voltage is applied between the electrostatic electrode 28 and the wafer W, whereby the wafer W is attracted to the ceramic plate 20 with an electrostatic force. In this state, a process such as plasma CVD or plasma etching is performed on the wafer W. In this step, the temperature of the wafer W is controlled by heating the wafer W while applying a voltage to the inner heater electrode 22 and the outer heater electrode 24 or by cooling the wafer W while causing refrigerant, such as water, to circulate through the refrigerant passage 32 in the cooling plate 30. Note that the inner heater electrode 22 and the outer heater electrode 24 are connected to the inner power source 22p and the outer power source 24p, respectively, and are subjected to temperature control independently of each other. When the processing of the wafer W is finished, the voltage applied between the electrostatic electrode 28 and the wafer W is reduced to zero to remove the electrostatic force. Then, the wafer W is transported to another place by a transporting device (not illustrated).

In the electrostatic-chuck heater 10 and the method of manufacturing the same according to the present embodiment described above, the lower surface 20b and the upper surface 30a as bonding surfaces each have a higher surface roughness Ra in the outer part 20o or 30o than in the inner part 20i or 30i. Therefore, the expansion of the adhesive sheet 40s in the outer part is suppressed by an anchoring effect. Hence, the thickness of the adhesive-sheet layer 40 can be made uniform. Accordingly, the in-plane temperature of the wafer W can be made uniform.

In the electrostatic-chuck heater 10, the inner zone Z1 corresponding to the inner parts 20i and 30i is provided with the inner heater electrode 22, and the outer zone Z2 corresponding to the outer parts 20o and 30o is provided with the outer heater electrode 24. Therefore, even if the difference in surface roughness Ra produces a difference in heat conduction between the inner part and the outer part, the temperature of the inner heater electrode 22 and the temperature of the outer heater electrode 24 can be controlled independently of each other in accordance with the difference. Accordingly, the in-plane temperature of the wafer W can be made more uniform.

In the electrostatic-chuck heater 10, if the lower surface 20b of the ceramic plate 20 and the upper surface 30a of the cooling plate 30 each have a radius of 135 mm or greater, the adhesive sheet 40s particularly tends to be thinner in the outer part than in the inner part unless there is any difference in surface roughness Ra over the entirety of the bonding surfaces. Therefore, the application of the present invention to such a case has a greater significance.

In the electrostatic-chuck heater 10, if the outer parts 20o and 30o of the lower surface 20b and the upper surface 30a as the bonding surfaces each have a surface roughness Ra higher than 1.6 μm, the outer parts 20o and 30o produce a higher degree of anchoring effect. Therefore, the expansion of the adhesive sheet 40s in the outer part is further suppressed. Accordingly, the thickness of the adhesive-sheet layer 40 can be made more uniform. If the inner parts 20i and 30i each have a surface roughness Ra of 1.6 μm or lower, the inner parts 20i and 30i produce a relatively low degree of anchoring effect. Therefore, the adhesive sheet 40s expands to some extent in the inner part. Accordingly, the thickness of the adhesive-sheet layer 40 can be made more uniform. The upper limit of the surface roughness Ra in each of the outer parts 20o and 30o is not specifically limited to but may be, for example, 3.2 μm or lower or twice the surface roughness Ra in the inner part 20i or 30i or lower. In such a case, the adhesive sheet 40s tends to expand deep into surface irregularities, which reduces the probability that cavities may be produced.

The present invention is not limited to the above embodiment in any way and can be embodied in various ways within the technical scope thereof, of course.

For example, the above embodiment may be modified such that only the lower surface 20b of the ceramic plate 20 has a higher surface roughness Ra in the outer part 20o than in the inner part 20i, or only the upper surface 30a of the cooling plate 30 has a higher surface roughness Ra in the outer part 30o than in the inner part 30i. In such a case, although the anchoring effect is produced only on one side, the expansion of the adhesive sheet 40s in the outer part is still suppressed by the anchoring effect. Therefore, the thickness of the adhesive-sheet layer 40 can be made uniform.

The above embodiment concerns a case where the ceramic plate 20 is divided into two zones, i.e. the inner zone Z1 and the outer zone Z2, in which the heater electrodes 22 and 24 are provided respectively. Alternatively, the ceramic plate 20 may be divided into three or more zones, and a heater electrode may be provided in each of the zones. The shape of such zones is not specifically limited to but may be a semicircular shape, a sector shape, an arc shape, or the like, as well as a circular shape or an annular shape. Moreover, instead of dividing the ceramic plate 20 into several zones, a heater electrode may be arranged in such a manner as to run over the entirety of the ceramic plate 20.

The above embodiment concerns a case where the boundary between the inner part 20i and the outer part 20o and the boundary between the inner part 30i and the outer part 30o coincide with the virtual boundary B in plan view. Alternatively, the boundaries may not necessarily need to coincide with the virtual boundary B.

The above embodiment concerns a case where the ceramic plate 20 is provided with the heater electrodes 22 and 24 and the electrostatic electrode 28 embedded therein. The types of the electrodes are not limited, as long as any electrode is embedded in the ceramic plate 20. For example, at least one of the electrostatic electrode and the heater electrode may be embedded in the ceramic plate 20. Alternatively, an RF electrode may be embedded in the ceramic plate 20.

Figure 7:
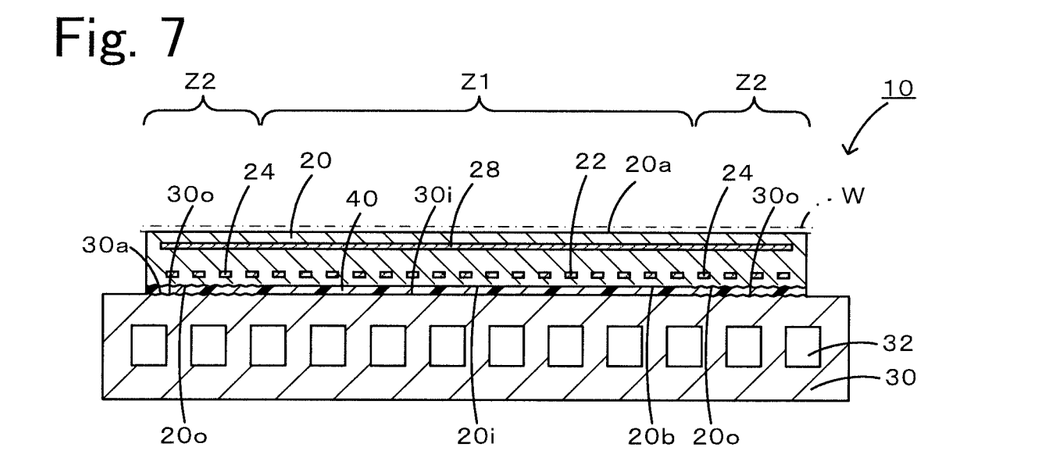
FIG. 7 is a sectional view, corresponding to FIG. 2, of another example of the electrostatic-chuck heater 10.

The above embodiment concerns a case where the cooling plate 30 has the upper surface 30a and the step surface 30c that is at a lower level than the upper surface 30a. Alternatively, as illustrated in FIG. 7, the cooling plate 30 may have a round columnar shape with no step surface 30c. In the latter case, the annular upper surface that surrounds the bonding surface may have the same surface roughness Ra as the outer part 30o or the inner part 30i, or a surface roughness Ra different from the surface roughnesses Ra of the outer and inner parts 30o and 30i.

This application claims priority based on Japanese Patent Application No. 2019-051398 filed on Mar. 19, 2019, the entire contents of which are incorporated herein by reference.

What is claimed is:

1. A wafer placement apparatus comprising:
   a disc-shaped ceramic plate having an upper surface as a wafer placement surface and in which an electrode is embedded;
   a disc-shaped cooling plate provided on a lower surface, opposite the wafer placement surface, of the ceramic plate; and
   a resin adhesive-sheet layer with which a bonding surface at the lower surface of the ceramic plate and a bonding surface at an upper surface of the cooling plate are bonded to each other,
   wherein at least one of the bonding surface of the ceramic plate and the bonding surface of the cooling plate has a surface roughness Ra that is higher in an outer part of the bonding surface than in an inner part of the bonding surface.

2. The wafer placement apparatus according to claim 1, wherein the electrode includes heater electrodes that are embedded in an inner zone and an outer zone, respectively, of the ceramic plate, the inner zone corresponding to the inner part, the outer zone corresponding to the outer part.

3. The wafer placement apparatus according to claim 1, wherein the bonding surface of the ceramic plate and the bonding surface of the cooling plate each have a radius of 135 mm or greater.

4. The wafer placement apparatus according to claim 1, wherein at least one of the bonding surface of the ceramic plate and the bonding surface of the cooling plate has a surface roughness Ra in the outer part that is higher than 1.6 μm.

5. A method of manufacturing a wafer placement apparatus, comprising:
   (a) a step of preparing a disc-shaped ceramic plate in which an electrode is embedded, a disc-shaped cooling plate, and an adhesive sheet; and
   (b) a step of bonding the ceramic plate and the cooling plate to each other by using the adhesive sheet,
   wherein at least one of the ceramic plate and the cooling plate to be prepared in the step (a) has a bonding surface with a surface roughness Ra that is higher in an outer part of the bonding surface than in an inner part of the bonding surface, and wherein the step (b) is performed by using the bonding surface with the surface roughness Ra that is higher in the outer part than in the inner part.

\* \* \* \* \*